(12) United States Patent
McGaughy et al.

(10) Patent No.: US 7,272,805 B2
(45) Date of Patent: Sep. 18, 2007

(54) SYSTEM AND METHOD FOR CONVERTING A FLAT NETLIST INTO A HIERARCHICAL NETLIST

(75) Inventors: Bruce W. McGaughy, Fremont, CA (US); Peter Frey, San Jose, CA (US); Boris Krichevskiy, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 324 days.

(21) Appl. No.: 10/993,686

(22) Filed: Nov. 19, 2004

(65) Prior Publication Data
US 2006/0112356 A1 May 25, 2006

(51) Int. Cl.
*G06F 17/50* (2006.01)
(52) U.S. Cl. .................. 716/3; 716/1; 716/5
(58) Field of Classification Search .............. 716/1, 716/3, 5
See application file for complete search history.

(56) References Cited

U.S. PATENT DOCUMENTS

| 5,446,676 | A | 8/1995 | Huang et al. |
| 5,553,008 | A | 9/1996 | Huang et al. |
| 6,665,845 | B1 * | 12/2003 | Aingaran et al. ............ 716/5 |

OTHER PUBLICATIONS

Celestry Design Technologies, Inc. (2001). *Celestry BSIM Pro+™ Basic Operations*, User Manual, Version 2001.3, Table of Contents, pp. iii-xiii.

Celestry Design Technologies, Inc. (2001). *Celestry BSIM Pro+™ Device Modeling Guide*, User Manual, Version 2001.3, Table of Contents; pp. iii-xii.

Feldman, P. et al. (May 1995). "Efficient Linear Circuit Analysis by Pade Approximation via Lanczos Process," *IEEE Transactions on CAD*, 14(5):639-649.

Kerns, K. et al. (1996). "Stable and Efficient Reduction of Large Multiport RC Networks by Pole Analysis via Congruence Transformations," *IEEE/ACM DAC*, pp. 280-285.

Pillage, L. T. et al. (Apr. 1990). "Asymptotic Waveform Evaluation for Timing Analysis," *IEEE Transactions on CAD*, 9(4):352-366.

U.S. Appl. No. 10/724,277, filed Nov. 26, 2003, by McGaughy et al.
U.S. Appl. No. 10/993,687, filed Nov. 19, 2004, by McGaughy et al.
Van der Spiegel, J. (1995). "SPICE—A Brief Overview," located at http://www.seas.upenn.edu/~jan/spice/spice.overview.html, last visited on Mar. 8, 2005, 19 pages.

* cited by examiner

*Primary Examiner*—Vuthe Siek
(74) *Attorney, Agent, or Firm*—Morrison & Foerster LLP

(57) ABSTRACT

System and method for converting a flat netlist into a hierarchical netlist are disclosed. The method includes receiving the flat netlist, traversing the flat netlist in a bottom-up fashion, and identifying isomorphic subcircuits in the flat netlist. The method further includes creating a set of cross-coupling capacitor collections for storing information of cross-coupling capacitors, creating a set of net collections for storing information of isomorphic subcircuits, traversing each hierarchical level of the hierarchical netlist in a top-down fashion, and generating the hierarchical netlist using the set of net collections and the set of cross-coupling capacitor collections.

48 Claims, 11 Drawing Sheets

| Net Collection 1: Net between Input and X1.X11.X21 (1 net) | | |
|---|---|---|
| | Anchor Node | X1.X11.X21.A |
| | Upward Call Path(s) | X1.X11.X21 |
| | RC Subcircuit | R1, R2, R3, Cg1, Cg2, Cg3 (RC1 of FIG 5) |
| | Downward Call Path(s) | Mn gate, Mp gate |

| Net Collection 2: Net between X21 and X22 (3 nets) | | |
|---|---|---|
| | Anchor Node | X1.X11.T1, X1.X12.T1, X1.X13.T1 (same T1 node) |
| | Upward Call Path(s) | X1.X11, X1.X12, X1.X13 |
| | RC Subcircuit | R4, R5, R6, R7, Cg4, Cg5, Cg6, Cg7 (RC2 of FIG 5) |
| | Downward Call Path(s) | X21.Mn source, X21.Mp drain, X22.Mn gate, X22.Mp gate |

| Net Collection 3: Net between X11 and X12 (1 net) | | |
|---|---|---|
| | Anchor Node | X1.T1 |
| | Upward Call Path(s) | X1 |
| | RC Subcircuit | R8, R9, R10, R11, Cg8, Cg9, Cg10, Cg11 (RC3 on FIG 5) |
| | Downward Call Path(s) | X11.X22.Mn source, X11.X22.Mp drain, X12.X21.Mn gate, X12.X21.Mp gate |

| Net Collection 4: Net between X12 and X13 (1 net) | | |
|---|---|---|
| | Anchor Node | X1.T2 |
| | Upward Call Path(s) | X1 |
| | RC Subcircuit | R8, R9, R10, R11, Cg8, Cg9, Cg10, Cg11 (RC3 of FIG 5) |
| | Downward Call Path(s) | X12.X22.Mn source, X12.X22.Mp drain, X13.X21.Mn gate, X13.X21.Mp gate |

| Net Collection 5: Net between X13.X22 and Out (1 net) | | |
|---|---|---|
| | Anchor Node | X1.X13.X22.Y |
| | Upward Call Path(s) | X1.X13.X22 |
| | RC Subcircuit | R1, R2, R3, Cg1, Cg2, Cg3 (RC1 of FIG 5) |
| | Downward Call Path(s) | Mn gate, Mp gate |

FIG. 3d

SYSTEM AND METHOD FOR CONVERTING A FLAT NETLIST INTO A HIERARCHICAL NETLIST

RELATED APPLICATIONS

This application is related to the following application, which is commonly owned by Cadence Design Systems, Inc. and is filed on the same date as this application, and is hereby incorporated by reference in its entirety: Electrical Isomorphism, Ser. No. 10/993,687.

FIELD OF THE INVENTION

The present invention relates to the problem of predicting with simulation the behavior of integrated circuits. In particular, the invention relates to a system and method for converting a flat netlist into a hierarchical netlist.

BACKGROUND OF THE INVENTION

A complex integrated circuit may contain millions of electronic components such as transistors, resistors, and capacitors. The design of such a complex integrated circuit may involve multiple teams of engineers. It is advantageous to partition the design of such complex integrated circuit using a hierarchical approach, whereby certain circuit components are grouped together and may be reused repeatedly through the integrated circuit or in a subsequent design. A method for design and simulation of an integrated circuit with a hierarchical data structure is disclosed by U.S. patent application Ser. No. 10/724,277, entitled "System and Method for Simulating a Circuit Having Hierarchical Structure", filed on Nov. 26, 2003, which is incorporated expressly by reference in its entirety herein.

FIG. 1a illustrates an example of a chain of six inverters in a circuit design. The chain of inverters couples to each other back-to-back. At the highest level of the hierarchical netlist, the root level, the chain of inverters includes an input power signal Vin, a chain of six inverters X1 (Level 1), a power supply V1 coupled to the Vdd terminals of the inverters, and a capacitor load Cload coupled to the output of the chain of six inverters X1. An instance name of the chain of six inverters is X1. At Level 1, the chain of inverters may be grouped into three groups of subcircuits, namely X11, X12, X13 (Sub2), and each group of Sub2 is coupled to the next group of Sub2 through the net T1 or T2 as shown in FIG. 1a. At Level 2, each Sub2 circuit includes two inverters coupled back-to-back via the net T1. Each inverter comprises an input net A, an output net Y, a PMOS transistor Mp, and an NMOS transistor Mn.

FIG. 1b illustrates a hierarchical representation of the chain of inverters of FIG. 1a according to an embodiment of the present invention. At the root level, also referred to as Level 0, the components Vin, V1, Cload, and the ports In, Out, Vdd and 0 (Gnd) are connected as shown. In addition, the root level includes a reference to Level 1 though a call function having a set of call parameters (In, Out, Vdd, 0). At Level 1, the call parameters from the root level are received at a port having a corresponding set of parameters (In, Out, Vdd, 0). The subcircuits X11, X12, X13 are connected via the nodes In, T1, Vdd, 0, T2 and Out respectively. Level 1 includes references to Level 2 through three call functions originating from subcircuits X11, X12, and X13. Each of the call functions of subcircuits X11, X12, and X13 has a set of parameters (In, Out, Vdd, 0). Similarly at Level 2, the call parameters from Level 1 are received at a port having a corresponding set of parameters (In, Out, Vdd, 0). The subcircuits X21 and X22 are connected via the nodes In, T1, Out, Vdd, and 0 respectively. Level 2 includes references to an inverter (Level 3) through two call functions originating from subcircuits X21 and X22. Each of the call functions of subcircuits X21 and X22 has a set of parameters (In, Out, Vdd, 0). At Level 3, a single inverter formed by a PMOS transistor Mp and an NMOS transistor Mn, which is also referred to as a leaf circuit, is coupled to the nodes In, Out, Vdd, and 0 as shown in FIG. 1b.

The hierarchical representation of the chain of six inverters as shown in FIG. 1b works well as a behavior model for design and simulation of the integrated circuit. However, it does not accurately represent all the physical aspects of the circuit after it is laid out and back-annotated as a flat netlist, which is also referred to as a gate-level netlist.

Existing circuit simulators simulate a back-annotated circuit, such as the chain of inverters of FIG. 1a, as a flat circuit. As a result, the performance of the simulation suffers significantly because of the large number of circuit components, such as the back-annotated parasitic resistors and capacitors, which have to be simulated. Additionally, simulating the flat netlist requires more memory because of the large number of circuit components of the back-annotated flat netlist. Therefore, there is a need for a system and method for converting a flat netlist into a hierarchical netlist for the simulation of a complex integrated circuit.

SUMMARY

In one embodiment, a method for converting a flat netlist into a hierarchical netlist includes receiving the flat netlist, traversing the flat netlist in a bottom-up fashion, and identifying isomorphic subcircuits in the flat netlist. The method further includes creating a set of cross-coupling capacitor collections for storing information of cross-coupling capacitors, creating a set of net collections for storing information of isomorphic subcircuits, traversing each hierarchical level of the hierarchical netlist in a top-down fashion, and generating the hierarchical netlist using the set of net collections and the set of cross-coupling capacitor collections.

In another embodiment, a system for converting a flat netlist into a hierarchical netlist includes at least one processing unit for executing computer programs, a memory for storing the flat netlist and the hierarchical netlist, and a user interface. The system further includes means for receiving the flat netlist, means for identifying isomorphic subcircuits in the flat netlist, means for creating a set of cross-coupling capacitor collections, means for creating a set of net collections, and means for generating the hierarchical netlist using the set of net collections and the set of cross-coupling capacitor collections.

In yet another embodiment, a computer program product includes a medium storing computer programs for execution by one or more computer systems. The computer program product includes a netlist conversion module for converting a flat netlist into a hierarchical netlist, where the netlist conversion module is used in conjunction with at least a processing unit, a user interface, and a memory. The netlist conversion module further includes one or more computer programs containing instructions for receiving the flat netlist, identifying isomorphic subcircuits in the flat netlist, creating a set of cross-coupling capacitor collections, creating a set of net collections, and generating the hierarchical netlist using the set of net collections and the set of cross-coupling capacitor collections.

BRIEF DESCRIPTION OF THE DRAWINGS

The aforementioned features and advantages of the invention as well as additional features and advantages thereof will be more clearly understandable after reading detailed descriptions of embodiments of the invention in conjunction with the following drawings.

FIG. 3d illustrates examples of net collections of the chain of six inverters according to an embodiment of the present invention.

DESCRIPTION OF EMBODIMENTS

Figure 1A:
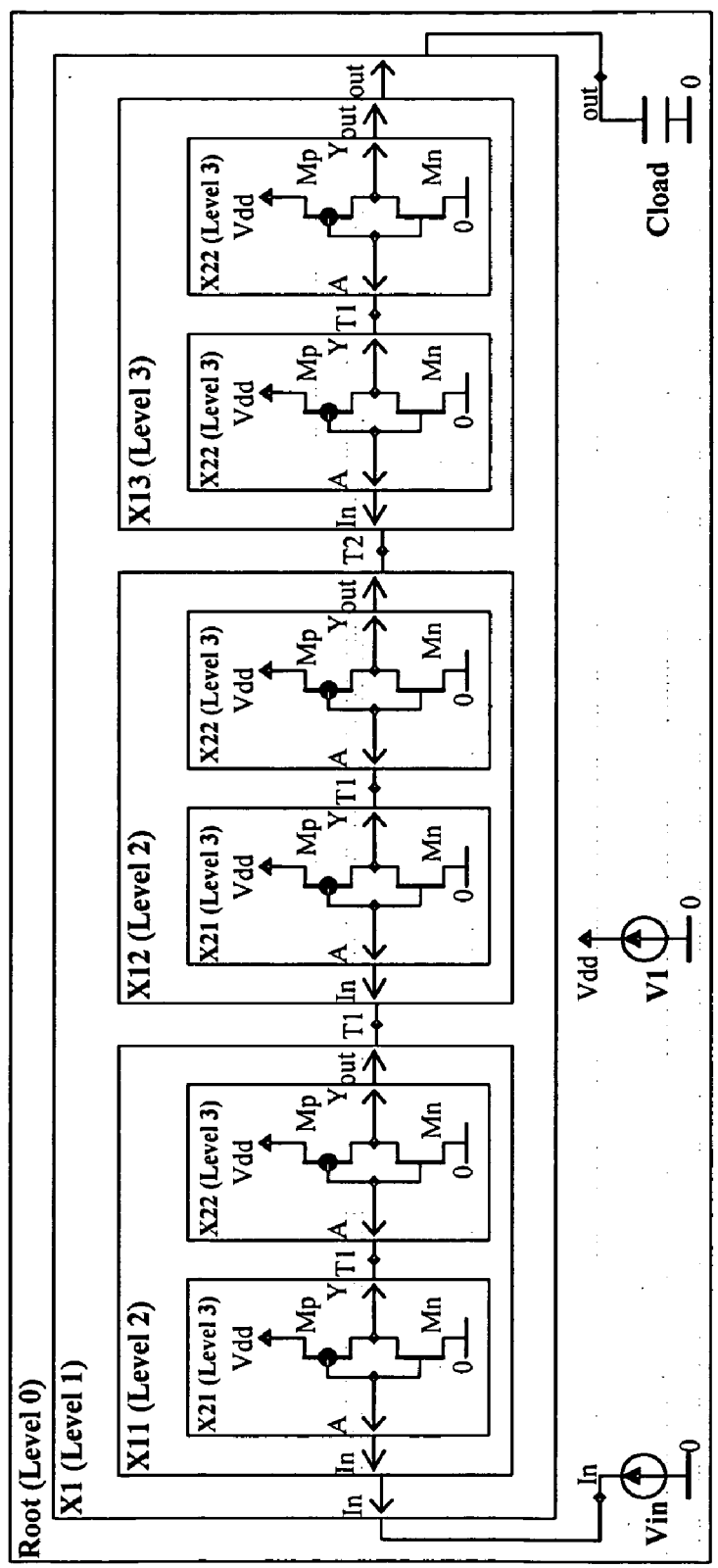
FIG. 1a illustrates an example of a chain of six inverters in a circuit design.

Methods and systems are provided for converting a flat netlist into a hierarchical netlist. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Definitions

Instance-based Netlist. An instance-based netlist provides a list of the instances used in a design. Along with each instance, either an ordered list of net names or a list of pairs of an instance port name along with the net name to which that port is connected, is provided. In this description, the list of nets can be gathered from the connection lists, and there is no place to associate particular attributes with the nets themselves. A SPICE netlist is an example of an instance-based netlist.

Net-based Netlist. A net-based netlist describes each net and provides information about the port to which it is connected for each instance. The net-based netlist allows attributes to be associated with nets. Detailed Standard Parasitic Format (DSPF) and Standard Parasitic Exchange Format (SPEF) are examples of net-based netlists.

Flat Netlist. A flat netlist contains only instances of primitive or leaf circuits. A back-annotated netlist generated by a place-and-route tool is usually described in the form of a flat netlist, which contains the physical characteristics of the circuit with parasitic resistors and capacitors.

Hierarchical Netlist. In large integrated circuit designs, it is a common practice to divide a design into pieces. Each piece is called a subcircuit, which can be used repeatedly as instances in the design. A subcircuit that includes no instance is referred to as a primitive or leaf circuit. A netlist description of a circuit that includes levels of instances is referred to as a hierarchical netlist. A hierarchical netlist/design may be flattened into a flat netlist/design via a recursive algorithm.

Folded Hierarchical Netlist. A folded hierarchical netlist allows a single definition to be represented several times by instances. Folded hierarchies can be very compact. The task is to stitch the net-based flat netlist of parasitic elements extracted from the layout to the instance-based folded hierarchical schematics netlist, and keep its compaction as much as possible. The netlist of parasitic elements contains the list of nets. Each net is associated with a net in the schematics netlist and describes the connection of instances via parasitic RCs.

Unfolded Hierarchical Netlist. An unfolded hierarchical netlist does not allow a definition of a subcircuit to be used more than once in the netlist.

Anchor Subcircuit (AS). An anchor subcircuit is a subcircuit at the lowest level of hierarchy that contains all instances that are connected to a particular net.

Anchor Node (AN). An anchor node is a local node at an anchor subcircuit, which is associated with a particular net.

Anchor Path (AP). An anchor path is a list of subcircuits in the hierarchical netlist, which describes the path from the root level to the anchor subcircuit.

RC Subcircuit (RC). An RC subcircuit describes the connections of parasitic elements, such as parasitic resistors and capacitors, of a particular anchor subcircuit.

Net Collection (NC). A net collection is a collection of nets that describe the paths from root to devices in all levels of the hierarchical design. A net collection contains nets having the same anchor path and substantially the same isomorphic behaviors RC subcircuits. A net collection is also referred to as an RC net collection.

Instance Path (IP). An instance path is a list of instances in the hierarchical netlist, which contains a particular instance and its associated port (node).

Cross-coupling Capacitor (Cross-CC). A cross-coupling capacitor connects between two nodes in two different RC nets. FIG. 1c illustrates cross-coupling capacitors in a layout of an integrated circuit. FIG. 1d illustrates a schematic representation of the integrated circuit of FIG. 1c. As shown in FIG. 1c, a Cross-CC is formed between two wires. This Cross-CC should be included in a back-annotated netlist for simulating the impact of one wire on the other wire, which is important in crosstalk analysis.

Figure 2A:
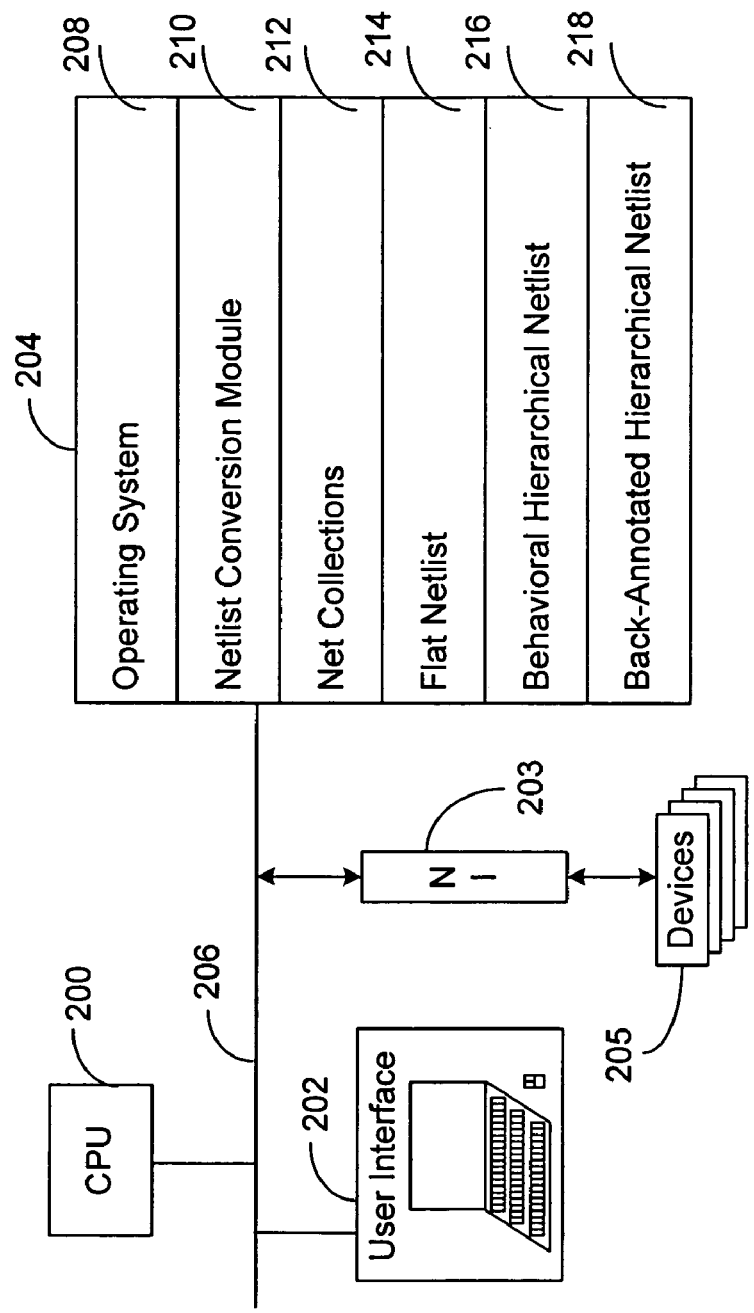
FIG. 2a illustrates a computer system for converting a flat netlist into a hierarchical netlist.

In one embodiment, a system for converting a flat netlist into a hierarchical netlist is implemented using a computer system schematically shown in FIG. 2a. The computer system includes one or more central processing units (CPUs) 200, at least a user interface 202, a memory device 204, a system bus 206, and one or more bus interfaces for connecting the CPU, user interface, memory device and system bus together. The computer system also includes at least one network interface 203 for communicating with other devices 205 on a computer network. In alternative embodiments, much of the functionality of the circuit simulator may be implemented in one or more application specific integrated circuits or field-programmable gate arrays, thereby either eliminating the need for a CPU, or reducing the role of the CPU in simulating the integrated circuit.

The memory device 204 may include a high-speed random access memory or may also include a non-volatile memory, such as one or more magnetic disk storage devices. The memory device 204 may also include mass storages that are remotely located from the central process unit(s) 200. The memory device 204 preferably stores:

an operating system 208 that includes procedures for handling various basic system services and for performing hardware dependent tasks;
a netlist conversion module 210, for converting a flat netlist into a hierarchical netlist;
a set of net collections 212, for storing the net collection at each level of the hierarchy of the hierarchical netlist;
a flat netlist 214;
a behavioral hierarchical netlist 216; and
a back-annotated hierarchical netlist 218.

The netlist conversion module, net collections, flat netlist, hierarchical netlist, and back-annotated hierarchical netlist may include executable procedures, sub-modules, tables, and other data structures. In other embodiments, additional or different modules and data structures may be used, and some of the modules and/or data structures listed above may not be used.

Figure 2B:
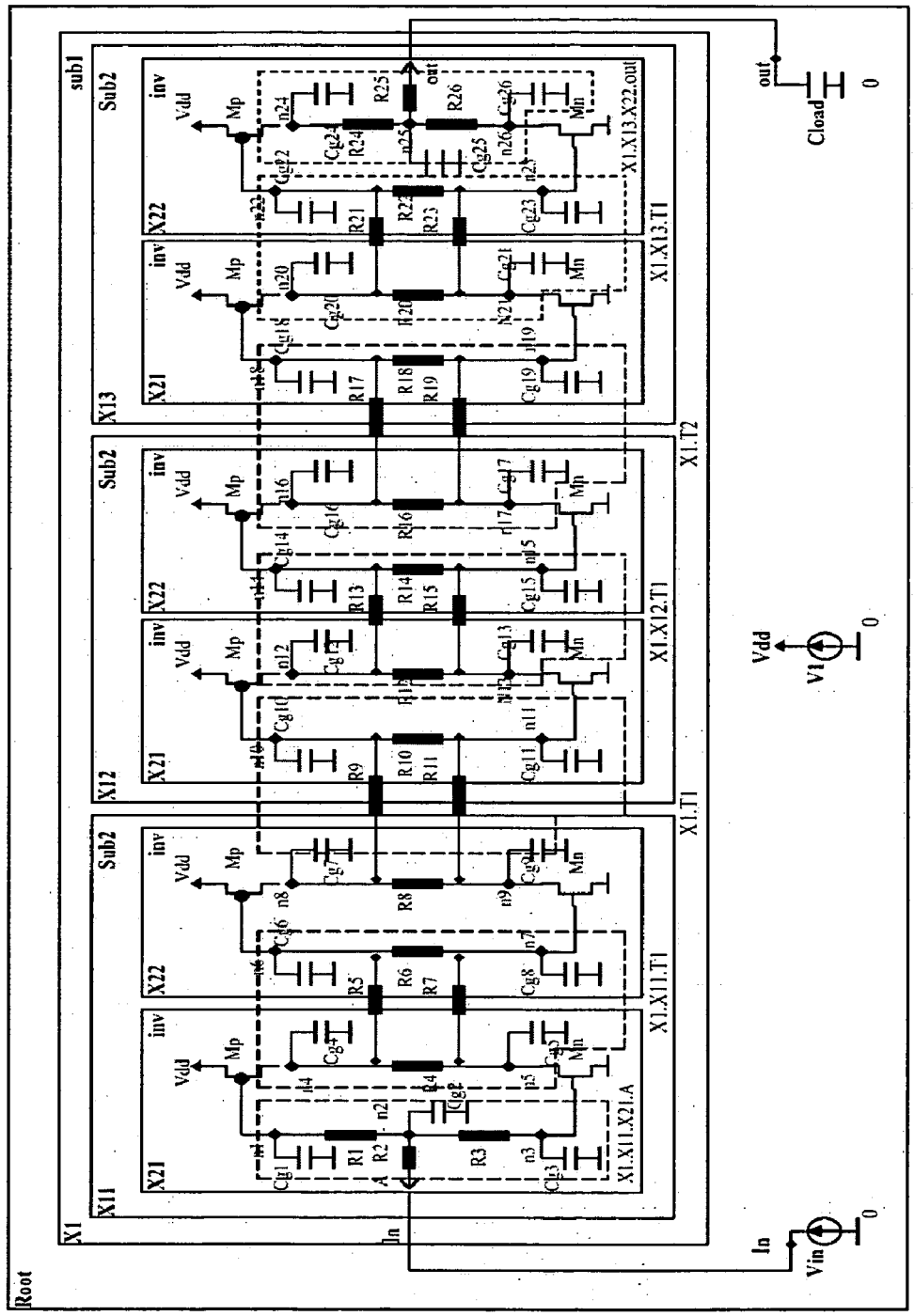
FIG. 2b illustrates an example of the chain of six inverters of FIG. 1a after incorporating the parasitic resistors and capacitors of the circuit in a flat netlist.

FIG. 2b illustrates an example of the chain of six inverters of FIG. 1a after incorporating the parasitic resistors and capacitors of the circuit in a flat netlist. For example, to accurately represent the inverter X11.X21, resistor R1 and capacitor Cg1 are coupled to the input terminal of transistor Mp; resistor R2 and capacitor Cg2 are coupled to the input node A. In addition, resistor R3 and capacitor Cg3 are coupled to the input terminal of transistor Mn; resistors R4, R5, and R7 and capacitors Cg4 and Cg5 are coupled to the output terminal of inverter X21. The connectivity of parasitic resistors and capacitors of the inverters X11.X22, X12.X21, X12.X22, X13.X21, and X13.X22 of the chain of six inverters is shown in FIG. 2b.

Figure 3A:
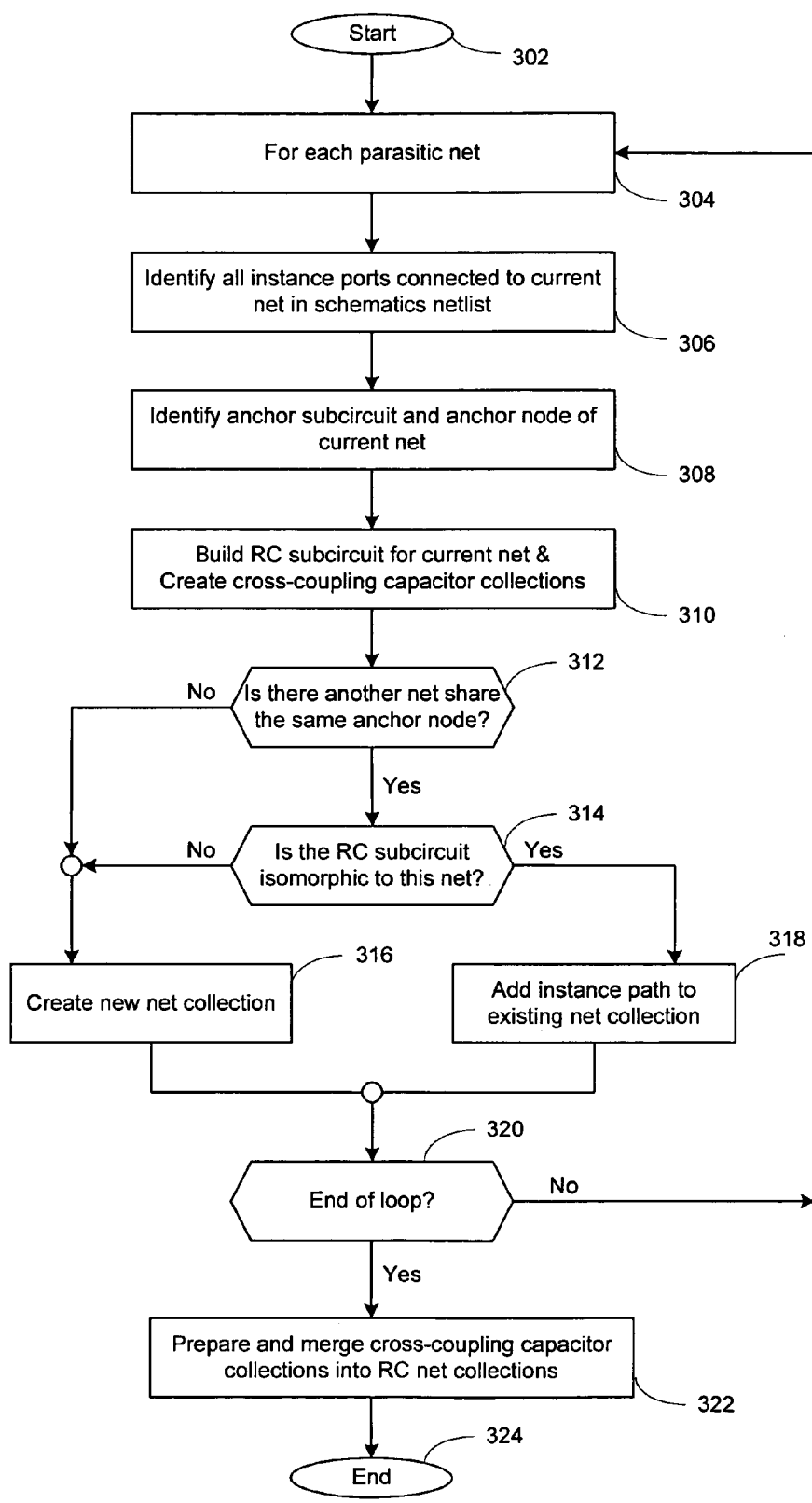
FIG. 3a illustrates a method for forming a set of net collections at each hierarchical level of the hierarchical netlist according to an embodiment of the present invention.

FIG. 3a illustrates a method for forming a set of net collections at each hierarchical level of a hierarchical netlist according to an embodiment of the present invention. The goal of forming the set of net collections is to create RC subcircuit, to identify anchor subcircuit and anchor node for each net, and to reduce the number of nets to be stitched in a subsequent process described in FIG. 4. The method starts in step 302 and thereinafter moves to step 304 where the method enters a loop for processing each parasitic net of the flat netlist in a bottom-up fashion. In step 306, the method identifies all instance ports connected to the current parasitic net in the flat netlist. In step 308, the method identifies anchor subcircuit and anchor node of the current parasitic net.

In step 310, the method builds a resistor-capacitor (RC) subcircuit for the current net in accordance with the identified anchor node and anchor subcircuit. In addition, the method creates a set of cross-coupling capacitor collections. In particular, for every net, the Cross-CC connected to its nodes is summed for every node and stored in an RC net as an expected coupling capacitor. A net collection containing only a cross-coupling capacitor is created when a Cross-CC appears a second time, that is, both cross-coupled nets are stitched. Otherwise, if a cross-coupling capacitor appears only once, indicating either the cross-coupled net has errors or the cross-coupled net is excluded due to selective stitching, the method deletes the cross-coupled net and lumps the Cross-CC to a circuit ground.

In step 312, a first determination is made as to whether there is another net with the same anchor node in the flat netlist. If there is another net with the same anchor node in the flat netlist (312_yes), the method continues in step 314. In the alternative, if there is not another net with the same anchor node in the flat list (312_no), the method moves to step 316. In step 314, a second determination is made as to whether the RC subcircuit has substantially the same isomorphic behaviors as the current net. Determining whether the two RC subcircuits have substantially the same isomorphic behaviors includes the following inquiries. First, whether the two RC subcircuits have substantially the same set of input signals. Second, whether the two RC subcircuits have substantially the same set of internal topologies, internal states, and external loads. Third, whether the two RC subcircuits have substantially the same set of output signals, which are within a set of predetermined thresholds of signal tolerances produced in response to substantially the same set of input signals. If the RC subcircuit has substantially the same isomorphic behaviors as the net (314_yes), the method continues in step 318. In the alternative (314_no), the method continues in step 316.

In step 316, the method creates a new net collection in response to the new net identified in step 312 or 314, and adds an instance path to the net collection. The data structure of a net collection is described below in association with FIG. 3b. In step 318, since the RC subcircuit is isomorphic to this net, the method adds an instance path to the existing net collection. In step 320, a third determination is made as to whether all the parasitic nets within the loop are processed. If all the parasitic nets within the loop have been processed (320_yes), the method moves to step 322. Otherwise, if one or more parasitic nets within the loop have not been processed (320_no), the method repeats steps 306 to 318 as described above.

In step 322, the method prepares and merges Cross-CC collections into RC net collections. A Cross-CC that does not belong to a stitched net is placed between the nets. This Cross-CC can be represented by a net collection and considered as a stand-alone net by itself. However, there are differences between a Cross-CC collection and a net collection containing an RC network:

A Cross-CC collection has no anchor node (the local node in the anchor subcircuit).
A Cross-CC collection has no existing connection in the netlist. The connection is established during stitching.
A Cross-CC collection may have terminals absent from the netlist if the Cross-CC is connected to an intermediate node of an RC net. The terminal is represented by a target net collection with a local node in the net collection.

The following pseudo-codes describe the steps taken to prepare and merge Cross-CC collections into RC net collections:

```
Create an array of sets CcSet[0 : number of RC net collections];
// Presorting the cross-coupling capacitors
Loop for each cross-cc net =i
{
    j1 = targeted RC net collection for the first terminal;
    j2 = targeted RC net collection for the second terminal;
    Insert cross-cc[i] into CcSet[j1];
    Insert cross-cc[i] into CcSet[j2];
}
Loop for each RC net collection = NC[j]
{
    n = number of nets in NC[j];
    l = number of nodes in NC[j], expecting the cross-cc;
    Create an array CCexp[0 : n, 0 : l];
    Loop for each i=0 to l
    {
        CCexp[0-n, i] = expected CC for i local node;
    }
    // Calculate the arrived cross-coupling caps
    Loop for each CC[k] in CcSet[NC[j]]
    {
        Find CC[k] terminal call path of first terminal
        between anchor paths of NC[j];
        q = index of found path;
        t = local node in NC[j], targeted by CC[k] first terminal;
        CCexp[q,t] = CCexp[q,t] – CC[k].value;
        Find CC[k] terminal call path of second terminal between
        anchor paths of NC[j];
        q = index of found path;
        t = local node in NC[j], targeted by CC[k] second terminal;
        CCexp[q,t] = CCexp[q,t] – CC[k].value;
    }
    // Now, the values of not delivered cross-coupling capacitors to
    all nodes of NC[j] are obtained.
    // For every node from 0 to l group the values with respect to
    acceptable tolerance.
    tolerance = acceptable tolerance for lumped caps (for
    instance, 5%, i.e. 0.05);
    ranges = 1/tolerance (number of ranges);
    Loop for i=0 to l (for each coupled node)
    {
    Create array of sets LumpSets[0 : ranges];
    Create array of average lumped caps LumpC[0 : ranges];
        grid = ranges/(expected CC for i local node);
        Loop for t=0 to n (for each net in NC[j])
        {
            r = CCexp[t,i] * grid;
            LumpC[r] = LumpC[r] + CCexp[t,i];
            insert t in LumpSets[r];
        }
    //Add lumped capacitors
    Loop for r=0 to ranges
    {
        if LumpSets[r] is not empty then
        {
            Create new Cross-CC collection:
            - put anchor paths of nets from
            LumpSets[r] to anchor paths of
            Cross-CC collection;
            - set the capacitor's value = LumpC[r]
            /LumpSets[r].size;
            - connect first terminal to local node i;
            - connect second terminal to ground;
        }
    }
    // Note that the RC-net of NC[j] should not be changed. If
    it is necessary to split the subcircuit at
    // NC[j] anchor subcircuit during stitching, it will be made
    due to different lumped capacitors.
    // Try to merge the cross-coupling caps from CcSet[NC[j]],
    connected to node [i]
    // analyze the terminal paths of cross-coupling caps from the
    node [i] upward
    for level=NC[j] anchor level to root, level=level-1
    {
        if CCterm[j1] != CCterm[j2] at level, then
        {
```

-continued

```
            if CCterm[j1] begins from level, then
                Mark CCterm[j1] to be connected to
                the node, created for CCterm[j2];
            else if CCterm[j2] begins from level, then
                Mark CCterm[j2] to be connected to
                the node, created for CCterm[j1];
            else
                Mark CCterm[j2] to be switched to
                CCterm[j1] from level+1;
                (this means, the CCterm[j2] is
                propagated through the same
                    connection as CCterm[j1] )
        }
    }
    } // End loop for each local node
} // End loop for each NC[j]
```

Figure 3B:
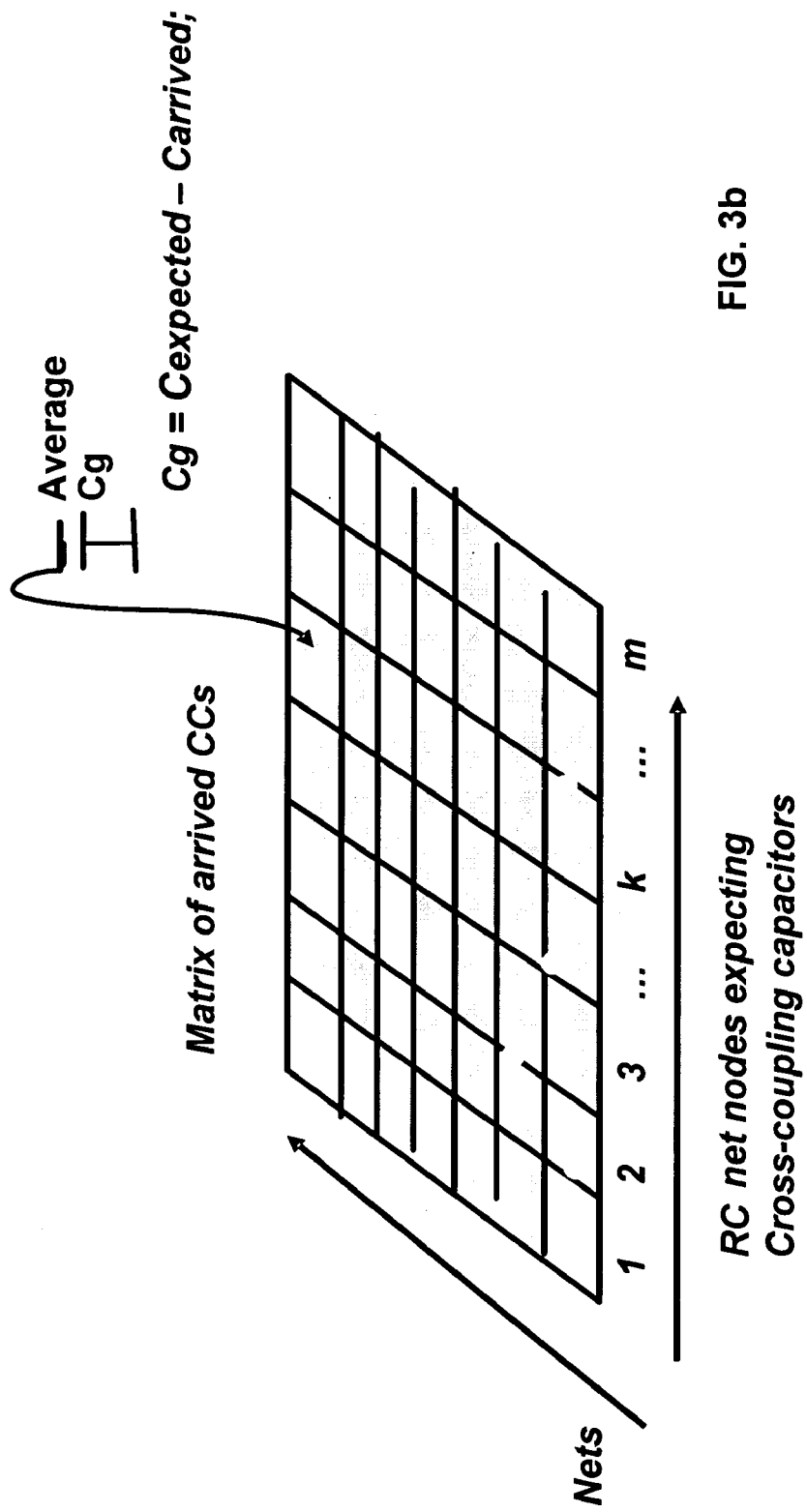
FIG. 3b illustrates a graphical representation of the matrix of cross-coupling capacitors according to an embodiment of the present invention.

FIG. 3b illustrates a graphical representation of the matrix of Cross-CCs described by the pseudo-codes above. The horizontal axis represents nodes in the RC net collection that expect Cross-CCs. The vertical axis represents the nets in the set of net collections. After step 322 in FIG. 3a, all Cross-CCs are prepared and merged into Cross-CC collections. The Cross-CC collections are also created for non-stitched Cross-CCs. The method ends in step 324 of FIG. 3a.

Figure 3C:
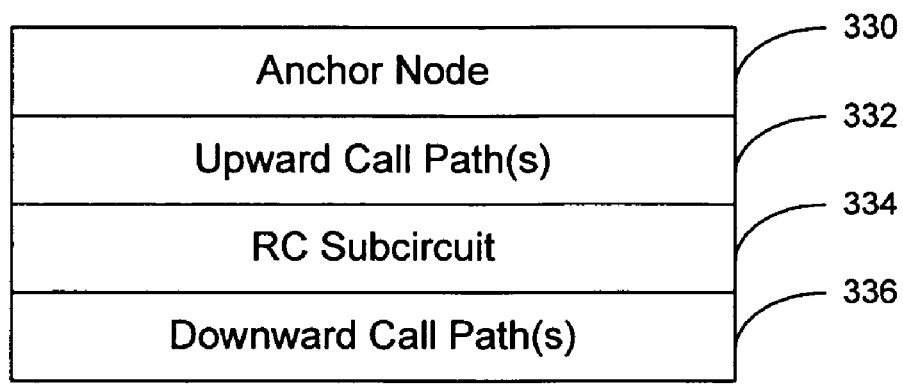
FIG. 3c illustrates the data structure of a net collection according to an embodiment of the present invention.

FIG. 3c illustrates the data structure of a net collection according to an embodiment of the present invention. The data structure of a net collection includes an anchor node 330, one or more upward call paths 332, an RC subcircuit 334, and one or more downward call paths 336. The upward call paths contain upward descriptions of call paths from the root to the anchor nodes. The RC subcircuit contains descriptions of circuit elements and back-annotated parasitic elements of a net. The downward call paths contain downward descriptions of call paths from the anchor node to all elements and ports connected to the anchor node.

Figure 1B:
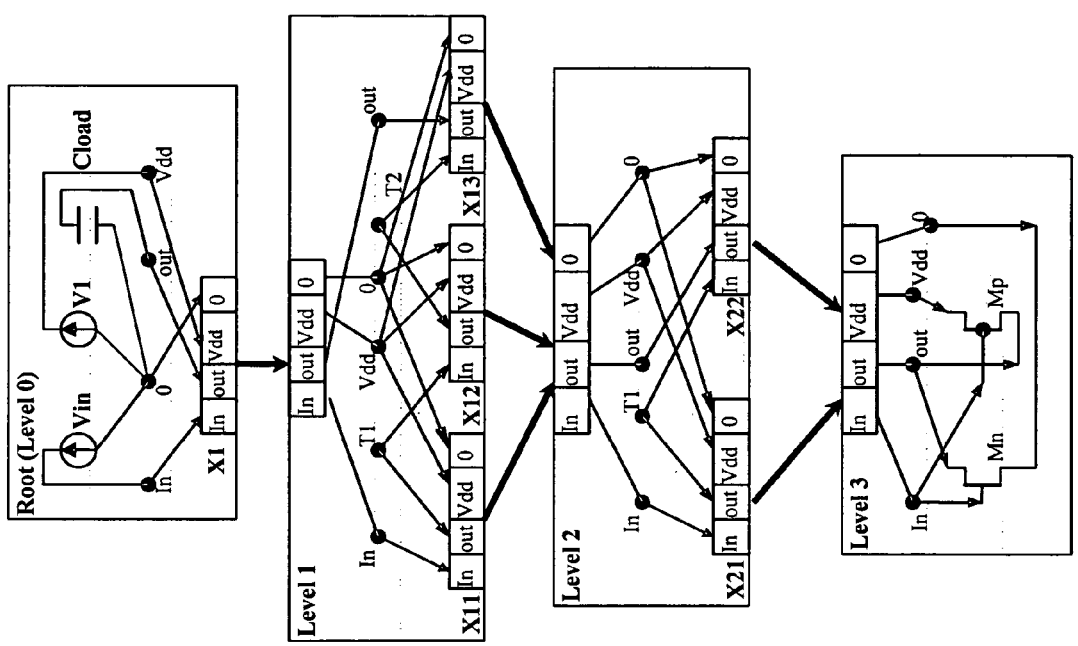
FIG. 1b illustrates a hierarchical representation of the chain of inverters of FIG. 1a according to an embodiment of the present invention.
Figures 1C, 1D:
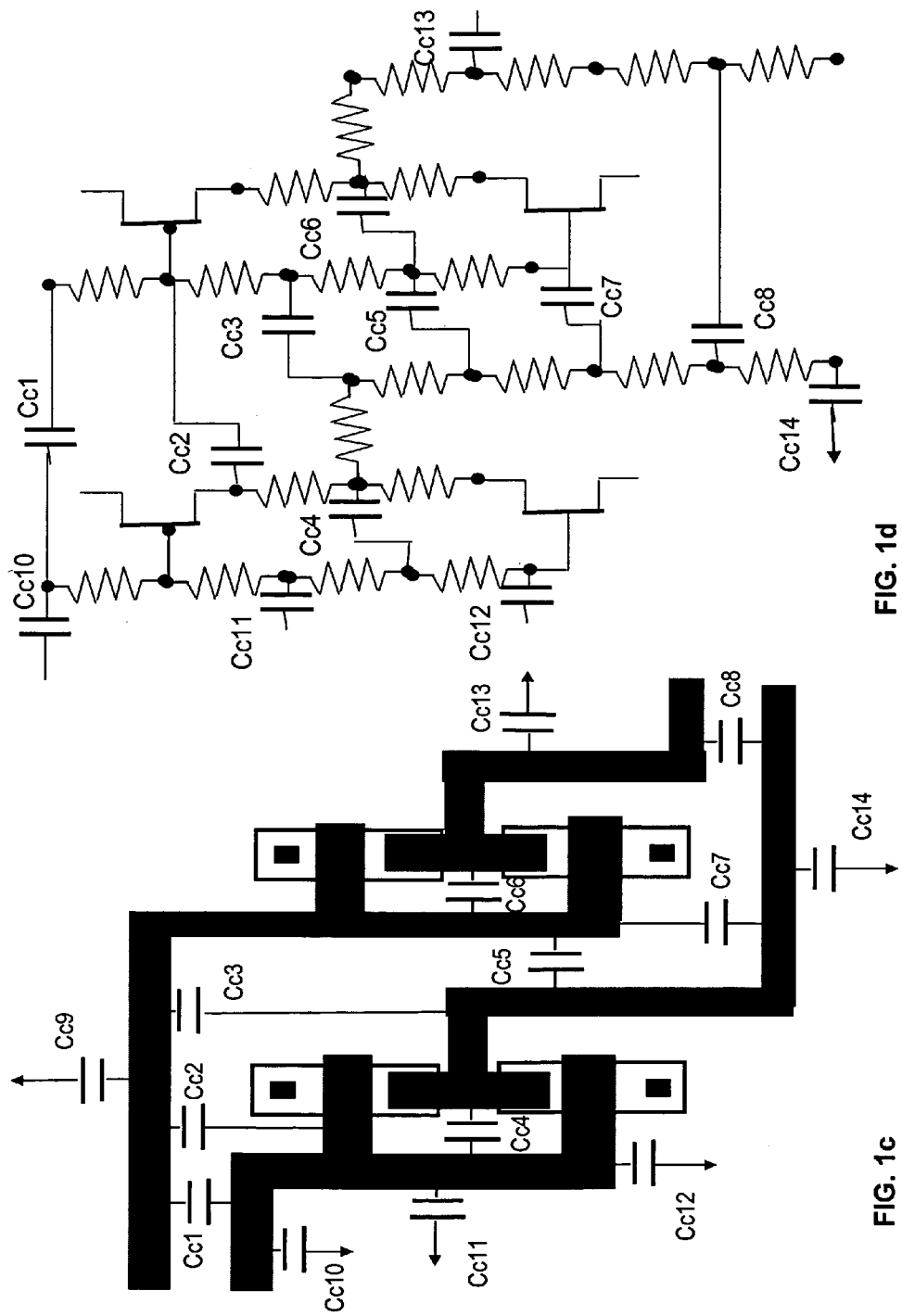
FIG. 1c illustrates cross-coupling capacitors in a layout of an integrated circuit.
FIG. 1d illustrates a schematic representation of the integrated circuit of FIG. 1c.

FIG. 3d illustrates examples of net collections of the back-annotated chain of six inverters of FIG. 1b according to an embodiment of the present invention. The parasitic netlist is analyzed in a net-by-net fashion and grouped into isomorphic net collections. Note that the nets in each net collection may have electrically isomorphic RC nets, identical connections to device terminals, and different instance paths (which go through the same subcircuits but with different calls). As shown in FIG. 3d, there are four net collections that contain one net and one net collection that contains three nets. Net collection 1 and net collection 5 have an electrically isomorphic RC subcircuit, but different anchor nodes and downward connections. The RC subcircuit for net collections 1 and 5 is represented by RC1 of FIG. 5 below. Net collections 3 and 4 have different anchor nodes T1 and T2 at the same RC subcircuit, which is represented by RC3 of FIG. 5. Net collection 2 contains three nets, namely X1.X11.T1, X1.X12.T1, and X1.X13.T1. These nets have the same anchor node T1 at the level 2 subcircuit, the same isomorphic RC subcircuit, and the same downward connections. The RC subcircuit for net collection 2 is represented by RC2 of FIG. 5.

Figure 4:
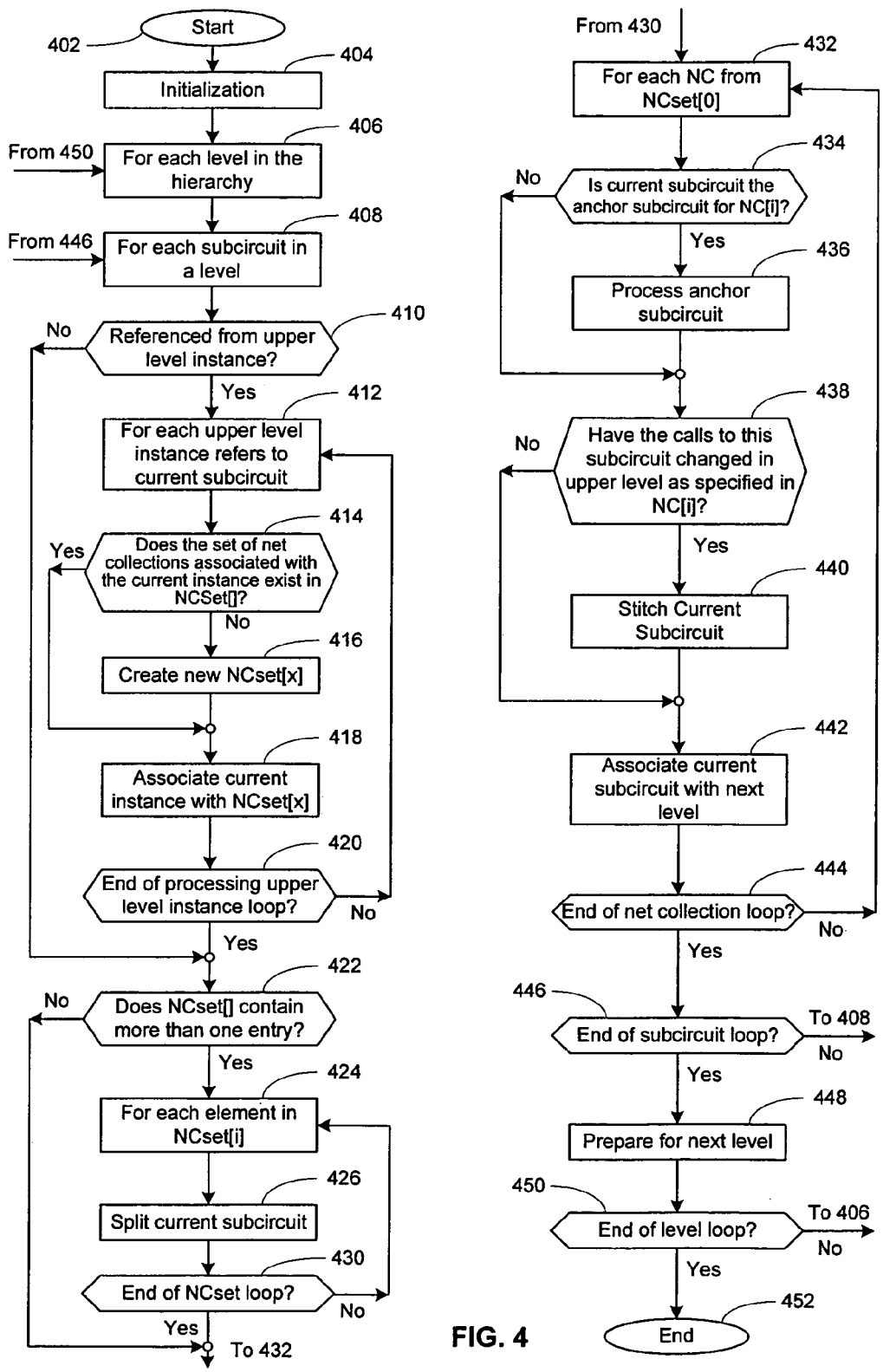
FIG. 4 illustrates a method for converting a flat netlist into a hierarchical netlist according to an embodiment of the present invention.

FIG. 4 illustrates a method for converting a flat netlist into a hierarchical netlist according to an embodiment of the present invention. The method creates and modifies the hierarchical netlist description of a particular circuit according to the parasitic nets in the flat netlist. The method starts in step 402 and thereinafter moves to step 404 where the method performs initialization for the net stitching operation. As part of the initialization process, the method puts all net collection sets into a net collection set array (NCset[ ]) to be analyzed. Then, the method places the root into the current subcircuit, which is to be processed initially. It then empties the next level subcircuit set to prepare for the subcircuit to be examined at the next level. Then, it sets the level to zero, indicating the root level is first to be processed.

In step 406, the method starts a first loop for processing each level of the hierarchical schematic netlist. The method stays in this loop until the current subcircuit set is empty (in other words, all the subcircuits in the current set have been processed). In step 408, the method starts a second loop for processing each subcircuit (in current subcircuit set) within a level of the hierarchical schematic netlist.

In step 410, a first determination is made as to whether the subcircuit is referenced by an upper level instance. If the subcircuit is not referenced by an upper level instance (410_no), indicating the current subcircuit is the root circuit, the method continues in step 422. In the alternative, if the subcircuit is referenced by an upper level instance (410_yes), indicating the current level is not the root circuit, the method moves to step 412 and starts a third loop for processing each upper level instance that refers to the current subcircuit. In step 414, a determination is made as to whether the net collections associated with the current instance exist in the array NCset[]. If the net collections exist in NCset (414_yes), the method continues in step 418. Otherwise, the method creates a new entry NCset[x] for the particular net collection set that describe the different call paths to the subcircuit in step 416. In step 418, the method associates current subcircuit with NCset[x]. In step 420, the method checks if it has completed processing all upper level instances that refers to the current subcircuit. If the result is negative (420_no), the method repeats steps 412 to 420. On the other hand, if the result is positive (420_yes), the methods continues at step 422.

In step 422, the method checks for whether the array NCset[] contains more than one entry. If the NCset[] does not contain more than one net collection set (422_no), the method continues in step 432. In the alternative (422_yes), the method starts a loop in step 424 for processing each net collection set in the array NCset[] other than NCset[0]. In step 426, the method splits the current subcircuit by 1) creating a placeholder for the subcircuit to be splitted; 2) creating reference paths from the upper level calls to the placeholder; 3) associating the placeholder with the NCset [i], the current net collection set being processed; and 4) inserting the placeholder into a current subcircuit set. In step 430, the method checks whether all net collection sets in the NCset[] have been processed. If all net collection sets in the NCset[] have been processed (430_yes), the method continues in step 432. Else if some net collection sets in the NCset[] have not been processed (430_no), the method continues to process other net collection sets in the NCset[] by repeating steps 424 to 430.

In step 432, the method enters the loop for processing each net collection (NC[i]) from the set NCset[0]. In step 434, the method checks if the current subcircuit is the anchor subcircuit for the net collection NC[i]. If the current subcircuit is not the anchor subcircuit (434_no), indicating either the anchor subcircuit is further down in the hierarchy or the current subcircuit already passed the anchor subcircuit, the method continues in step 438. In the alternative (434_yes), the method builds the RC subcircuit at the anchor subcircuit in step 436. In step 436, the method creates an instance for RC[NC[i]], which is the RC net for NC[i] net collection. It then creates new nodes necessary for connecting new subcircuits described in NC[i], which is the [i]th net collection from the NC set. In addition, the method inserts Cross-CC into the RC subcircuit at the anchor subcircuit. Furthermore, the method creates additional ports for calls to the subcircuits specified in NC[i] and connects the ports to the newly created nodes accordingly. Finally, the method reconnects elements as specified in downward paths of the net collection NC[i], which were previously connected to the anchor node of NC[i], if these elements are in the current subcircuit.

In step 438, the method checks whether the calls to this subcircuit have changed in the upper level as specified in NC[i], due to new ports created in the upper level. If the determination is positive (438_yes), the method moves to step 440 where it stitches the current subcircuit to the hierarchical schematic netlist. In one implementation, the method: 1) creates additional ports for the current subcircuit in response to the calls from the upper level; 2) creates additional nodes if necessary for the additional ports; 3) propagates new connectivity to the next level as specified in NC[i]; and 4) reconnects elements in this subcircuit to new ports specified in NC[i].

In step 442, the method associates the current subcircuit with the next level. In one implementation, the method associates with all calls in the current subcircuit as required by the net collection NC[i] to make the calls visible for the next level. It then inserts subcircuits, which are referenced by the calls into the next level subcircuit set at the next level.

In step 444, the method makes a determination as to whether all the elements in the set NCset[0] have been processed. If all the elements in the net collection set have been processed (444_yes), the method continues in step 446. Otherwise (444_no), the method repeats steps 432 to 444 for processing other elements in the set NCset[0]. In step 446, the method removes the processed subcircuit from current subcircuit set and checks whether the all the subcircuits in the level loop have been processed. If the determination is positive (446_yes), the method continues in step 448. If the determination is negative (446_no), the method goes to step 408 and continues to process other subcircuits in the level. In step 448, upon completing processing all subcircuits in a level, the method prepares for processing the next level. The method moves the next level subcircuit set into the current level subcircuit set, empties the next level subcircuit set, and increments the level counter. In step 450, the method checks whether all levels in the hierarchical schematic netlist have been processed. If one or more levels in the hierarchical schematic netlist have not been processed (450_no), the method moves to step 406 and continues processing other levels of the hierarchical schematic netlist. In the alternative, if all levels in the hierarchical schematic netlist have been processed (450_yes), the method ends in step 452.

Figure 5:
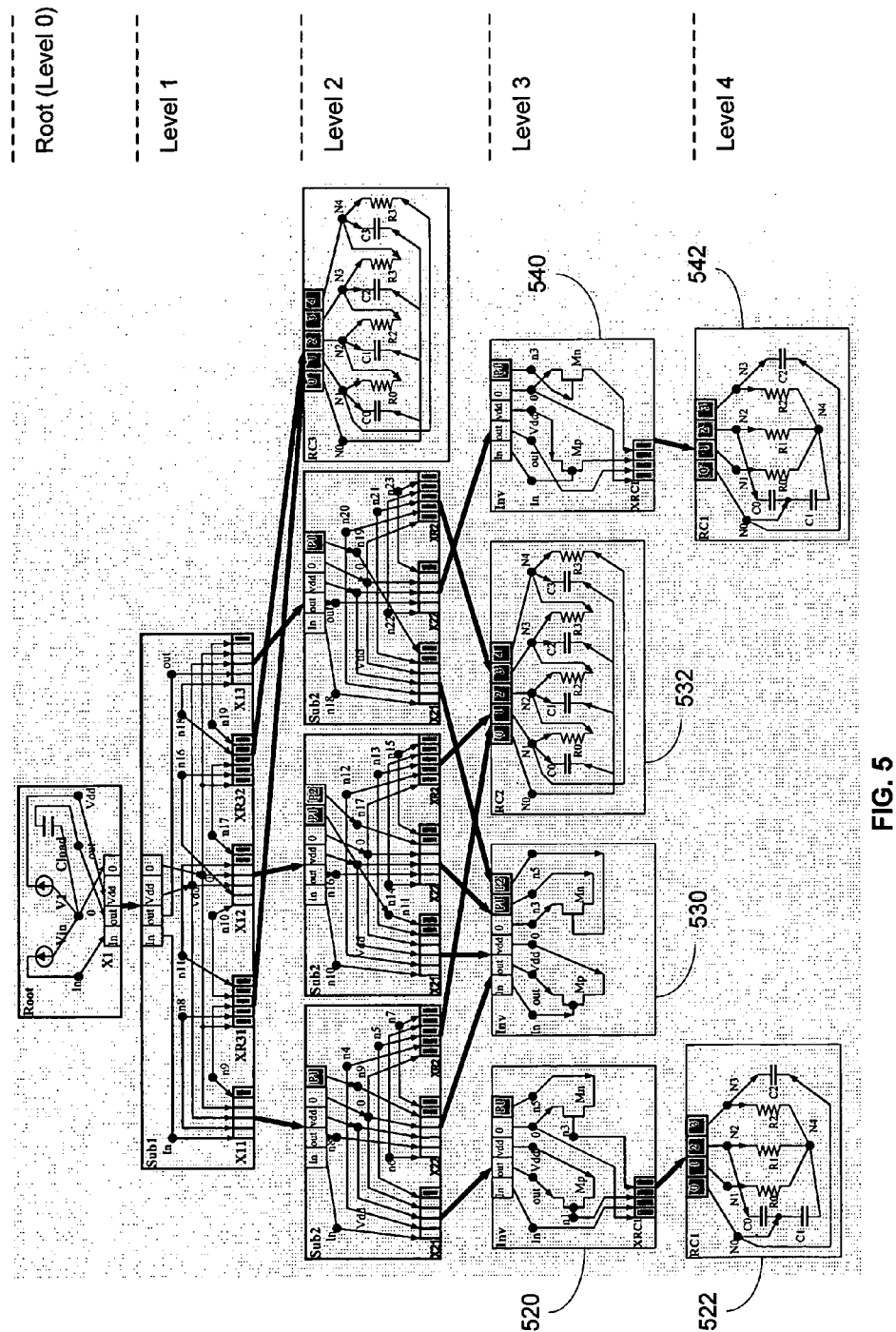
FIG. 5 illustrates a back-annotated hierarchical netlist of the chain of inverters of FIG. 2b according to an embodiment of the present invention.

FIG. 5 illustrates a back-annotated hierarchical netlist of the chain of inverters of FIG. 2b according to an embodiment of the present invention. At the root level, there is no change from the hierarchical representation in FIG. 2b. At Level 1, the X1 subcircuit includes calls XR31 and XR32 for referencing a newly created RC subcircuit RC3 that describes the RC network between the instances X11 and X12, and the RC network between the instances X12 and X13 respectively. In addition, one port is added to the X11 call, two ports are added to the X12 call, and one port is added to the X13 call for accommodating the additional ports in their corresponding referenced ports in the next level below. The ports between this level and the next level below are interconnected through nodes and calls as shown in the FIG. 5.

At Level 2, the RC3 subcircuit describes a compact representation of the RC network between the instances X11 and X12, as well as the RC network between the instances X12 and X13. In subcircuit Sub2*a*, a port P1 is created to accommodate the changes in the hierarchical netlist created. Additionally, a new call XR2 is created for referencing the RC network between a pair of back-to-back inverters, such as between the inverter X21 and X22. Furthermore, one port is added to the X21 call and two ports are added to the X22 call for accommodating the additional ports in their corresponding referenced ports in the next level below.

Similarly, in subcircuit Sub2*b*, ports P1 and P2 are created to accommodate the changes in the hierarchical netlist created. Additionally, a new call XR2 is created for referencing the RC network between a pair of back-to-back inverters, such as between the inverters X21 and X22. Furthermore, two ports are added to the X21 call and two ports are added to the X22 call for accommodating the additional ports in their corresponding referenced ports in the next level below.

At Level 3, there are three distinct instances of inverters Inv1, Inv2 and Inv3. In addition, there is a distinct instance of RC subcircuit RC2. The inverter Inv1 520 represents the first inverter in the chain of the six inverters. The inverter 520 is distinguished from other inverters because of its unique RC network at its input terminal. The block 522 represents the RC network at the input terminal of the inverter 520. The RC network 522 is referenced by the call XRC1 from the inverter 520. The inverter 520 is only referenced by subcircuit X21 of the subcircuit X11. The inverter Inv2 530 represents the middle four inverters in the chain of the six inverters. The inverter 530 is referenced by subcircuit X22 of the subcircuit X11, by subcircuits X21 and X22 of the subcircuit X12, and by subcircuit X21 of the subcircuit X13. The block 532 represents an instance of the RC networks between the internal inverters. Finally, the inverter Inv3 540 represents the last inverter in the chain of the six inverters. The inverter 540 is distinguished from other inverters because of its unique RC network at its output terminal. The block 542 represents the RC network at the output terminal of the inverter 540. The RC network 542 is referenced by the call XRC1 from the inverter 540. The inverter 540 is only referenced by subcircuit X22 of the subcircuit X13. Note that the parasitic elements of the RC subcircuits RC1, RC2, and RC3 shown in FIG. 5 are symbols only. They are not the actual parasitic elements of FIG. 2*b*. The actual parasitic elements of RC1, RC2, and RC3 are listed in FIG. 3*d*.

It is advantageous to simulate the back-annotated circuit of FIG. 2*b* in a hierarchical data structure as shown in FIG. 5. For example, if two or more inverters have substantially the same isomorphic behavior, one instance can be used to represent the two or more inverters. Any change to the instance is computed once. Therefore, there are fewer components to simulate and the performance of the simulation is improved. Benefits and aspects of a hierarchical data structure are described in U.S. patent application Ser. No. 10/724,277, filed on Nov. 26, 2003, which is incorporated herein expressly by reference.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

What is claimed is:

1. A method for converting a flat netlist into a hierarchical netlist, comprising:
   receiving the flat netlist;
   traversing the flat netlist in a bottom-up fashion, identifying isomorphic subcircuits in the flat netlist;
   creating a set of cross-coupling capacitor collections for storing information of cross-coupling capacitors;
   creating a set of net collections for storing information of isomorphic subcircuits;
   traversing each hierarchical level of the hierarchical netlist in a top-down fashion, generating the hierarchical netlist using the set of net collections and the set of cross-coupling capacitor collections; and
   storing the hierarchical netlist in a memory device.

2. The method of claim 1, wherein each cross-coupling capacitor collection comprises:
   a cross-coupling capacitor;
   a first set of call paths from a highest level of the hierarchical netlist to a lowest-level subcircuit which the cross-coupling capacitor is coupled to; and
   nodes of the cross-coupling capacitor.

3. The method of claim 1, wherein creating a set or cross-coupling capacitor collections comprises:
   identifying cross-coupling capacitors from the flat netlist;
   recording a first set of call paths from a highest level of the hierarchical netlist to lowest-level subcircuits which the cross-coupling capacitors are coupled to; and
   recording nodes of the cross-coupling capacitors.

4. The method of claim 1, wherein each net collection comprises:
   an anchor node;
   a set of upper call paths from a highest level of the hierarchical netlist to the anchor node;
   a resistor-capacitor (RC) subcircuit, wherein the RC subcircuit includes parasitic circuit
   elements back-annotated into each net of the net collection; and
   a set of lower call paths from the anchor node to parasitic circuit elements connected to the anchor node.

5. The method of claim 1, wherein creating a set of net collections comprises:
   for each parasitic net in the flat netlist,
      (a) identifying all ports connected to the parasitic net:
      (b) identifying an anchor subcircuit, wherein the anchor subcircuit supports multiple call paths for subcircuits below the anchor node;
      (c) identifying an anchor node, wherein the anchor node references one or more subcircuits having substantially the same isomorphic behaviors;
      (d) building a RC subcircuit at the anchor subcircuit;
      (e) optimizing duplicate anchor nodes;
      (f) updating the net collection; and
   repeating steps (a) to (f) until all parasitic nets in the flat netlist have been examined.

6. The method of claim 5, wherein building the RC subcircuit comprises:
   forming a RC subcircuit for representing parasitic resistors and capacitors connected to the parasitic net; and optimizing the RC subcircuit for creating a corresponding electrically substantially equivalent RC subcircuit having fewer resistor or capacitor elements.

7. The method of claim 5, wherein optimizing duplicate anchor nodes comprises:
if there is no parasitic net in the net collection share the same anchor node, creating a corresponding new net collection in the set of net collections;
if there is another parasitic net in the net collection share the same anchor node and the corresponding subcircuit of the anchor node does not have substantially the same isomorphic behaviors, creating a corresponding new net collection in the set of net collections; and
if there is another parasitic net in the net collection share the same anchor node and the corresponding subcircuit of the anchor node has substantially the same isomorphic behaviors; adding an instance path of the parasitic net to the set of net collections.

8. The method of claim 5, wherein substantially the same isomorphic behaviors between two RC subcircuits comprise:
substantially the same set of input signals;
substantially the same set of internal topologies, internal states, and external loads; and
substantially the same set of output signals are produced within a predetermined threshold of signal tolerance in response to substantially the same set of input signals.

9. The method of claim 5, wherein updating the net collection comprises:
traversing each node in the net collection;
determining a sum of expected cross-coupling capacitance at each node;
determining a sum of arrived cross-coupling capacitance at each node;
compute an average capacitance at each node based on the sum of expected cross coupling capacitance and the sum of arrived cross-coupling capacitance; and
linking the average capacitance at each node to the corresponding RC subcircuit described in the net collection.

10. The method of claim 1, wherein generating the hierarchical netlist comprises:
(1) traversing each hierarchical level in a top-down fashion;
(2) traversing each subcircuit within each hierarchical level;
  (a) forming a net collection set array (NCset) for each upper call path to an upper level subcircuit using the set of net collections;
  (b) if the NCset comprises more than one upper call paths, splitting the subcircuit;
  (c) stitching the subcircuit into the hierarchical netlist;
  (d) associating the subcircuit with a next level;
  (e) repeating steps (a) to (d) until all subcircuits in the hierarchical level have been processed;
(3) preparing a next level for processing; and
(4) repeating steps (1) to (3) until all levels of the hierarchical netlist have been processed.

11. The method of claim 10, wherein forming a NCset comprises:
if net collection sets associated with the subcircuit exist in the NCset, associating the subcircuit with the net collection sets; and
if the net collection sets associated with the subcircuit do not exist in the NCset, adding the net collection sets to the NCset.

12. The method of claim 10, wherein splitting the subcircuit comprises:
traversing each net collection set referenced to the subcircuit in the NCset;
creating a placeholder for the subcircuit;
creating reference paths from upper level calls to the placeholder;
associating the placeholder with the net collection set referenced to the subcircuit in the NCset; and
inserting the placeholder into a current subcircuit set.

13. The method of claim 10, wherein stitching the subcircuit comprises:
for each net collection in a first NCset (NCset[0])
if the subcircuit is the anchor subcircuit for the net collection,
  (a) creating an instance for the RC subcircuit;
  (b) creating additional nodes required for connecting a new subcircuit as described in the net collection;
  (c) creating additional ports for calls to the instance as specified in the net collection;
  (d) connecting the additional nodes and the additional ports as specified in the net collection; and
  (e) reconnecting elements of late subcircuit.

14. The method of claim 13 further comprising:
if calls to the subcircuit have changed in upper level as specified in the net collection,
  (a) creating additional ports for the subcircuit according to instances in upper level;
  (b) creating additional nodes for new ports;
  (c) changing calls from the subcircuit to a next level as specified in the net collection; and
  (d) reconnecting elements in the subcircuit to new ports as specified in the net collection.

15. The method of claim 14 further comprising:
associating calls in the subcircuit as specified by the net collection to a next level; and
inserting subcircuits referenced by the calls in a next level subcircuit set.

16. The method of claim 10, wherein preparing the next level for processing comprises:
swapping a current level subcircuit set and a next level subcircuit set;
initializing the next level subcircuit set; and
incrementing a level counter.

17. A system for converting a flat netlist into a hierarchical netlist, comprising:
at least one processing unit for executing computer programs;
a user interface for performing at least one of the functions selected from the group consisting of entering a netlist representation of the circuit, viewing representations of the circuit on a display, and observing simulation results of the circuit;
a memory far storing the flat netlist and the hierarchical netlist;
means for receiving the flat netlist;
means for traversing the flat netlist in a bottom-up fashion, identifying isomorphic subcircuits in the flat netlist;
means for creating a set of cross-coupling capacitor collections for storing information of cross-coupling capacitors;
means for creating a set of net collections for storing information of isomorphic subcircuits;
means for traversing each hierarchical level of the hierarchical netlist in a top-down fashion, generating the hierarchical netlist using the set of net collections and the set of cross-coupling capacitor collections; and means for storing the hierarchical netlist in a memory device.

18. The system of claim 17, wherein each cross-coupling capacitor collection comprises:

a cross-coupling capacitor;

a first set of call paths from a highest level of the hierarchical netlist to a lowest-level subcircuit which the cross-coupling capacitor is coupled to; and nodes of the cross-coupling capacitor.

19. The system of claim 17, wherein the means for creating a set of cross-coupling capacitor collections comprise:

means for identifying cross-coupling capacitors from the flat netlist;

means for recording a first set of call paths from a highest level of the hierarchical netlist to lowest-level subcircuits which the cross-coupling capacitors are coupled to; and means for recording nodes of the cross-coupling capacitors.

20. The system of claim 17, wherein each net collection comprises:

an anchor node;

a set of upper call paths from a highest level of the hierarchical netlist to the anchor node;

a resistor-capacitor (RC) subcircuit, wherein the RC subcircuit includes parasitic circuit elements back-annotated into each net of the net collection; and a set of lower call paths from the anchor node to parasitic circuit elements connected to the anchor node.

21. The system of claim 17, wherein the means for creating a set of net collections comprise:

for each parasitic net in the flat netlist,
(a) means for identifying all ports connected to the parasitic net;
(b) means for identifying an anchor subcircuit, wherein the anchor subcircuit supports multiple call paths for subcircuits below the anchor node;
(c) means for identifying an anchor node, wherein the anchor node references one or more subcircuits having substantially the same isomorphic behaviors;
(d) means for building a RC subcircuit at the anchor subcircuit;
(e) means for optimizing duplicate anchor nodes;
(f) means for updating the net collection; and means for repeating steps (a) to (f) until all parasitic nets in the flat netlist have been examined.

22. The system of claim 21, wherein the means for building the RC subcircuit comprise:

means for forming a RC subcircuit for representing parasitic resistors and capacitors connected to the parasitic net; and means for optimizing the RC subcircuit for creating a corresponding electrically substantially equivalent RC subcircuit having fewer resistor or capacitor elements.

23. The system of claim 21, wherein the means for optimizing duplicate anchor nodes comprise:

if there is no parasitic net in the net collection share the same anchor node, means for creating a corresponding new net collection in the set of net collections;

if there is another parasitic net in the net collection share the same anchor node and the corresponding subcircuit of the anchor node does not have substantially the same isomorphic behaviors, means for creating a corresponding new net collection in the set of net collections; and if there is another parasitic net in the net collection share the same anchor node and the corresponding subcircuit of the anchor node has substantially the same isomorphic behaviors, means for adding an instance path of the parasitic net to the set of net collections.

24. The system of claim 21, wherein substantially the same isomorphic behaviors between two RC subcircuits comprise:

substantially the same set of input signals;

substantially the same set of internal topologies, internal states, and external loads; and substantially the same set of output signals are produced within a predetermined threshold of signal tolerance in response to substantially the same set of input signals.

25. The system of claim 21, wherein the means for updating the net collection comprise:

means for traversing each node in the net collection;

means for determining a sum of expected cross-coupling capacitance at each node, means for determining a sum of arrived cross-coupling capacitance at each node;

means for compute an average capacitance at each node based on the sum of expected cross-coupling capacitance and the sum of arrived cross-coupling capacitance; and means for linking the average capacitance at each node to the corresponding RC subcircuit described in the net collection.

26. The system of claim 17, wherein the means for generating the hierarchical netlist comprise:

(1) means for traversing each hierarchical level in a top-down fashion;
(2) means for traversing each subcircuit within each hierarchical level;
 (a) means for forming a net collection set array (NCset) for each upper call path to an upper level subcircuit using the set of net collections;
 (b) if the NCset comprises more than one upper call paths, means for splitting the subcircuit;
 (c) means for stitching the subcircuit into the hierarchical netlist;
 (d) means for associating the subcircuit with a next level;
 (e) repeating steps (a) to (d) until all subcircuits in the hierarchical level have been processed;
(3) means for preparing a next level for processing; and
(4) means for repeating steps (1) to (3) until all levels of the hierarchical netlist have been processed.

27. The system of claim 26, wherein the means for forming a NCset comprise:

if net collection sets associated with the subcircuit exist in the NCset, means for associating the subcircuit with the net collection sets; and if the net collection sets associated with the subcircuit do not exist in the NCset, means for adding the net collection sets to the NCset.

28. The system of claim 26, wherein the means for splitting the subcircuit comprise:

means for traversing each net collection set referenced to the subcircuit in the NCset;

means for creating a placeholder for the subcircuit;

means for creating reference paths from upper level calls to the placeholder;

means for associating the placeholder with the net collection set referenced to the subcircuit in the NCset; and means for inserting the placeholder into a current subcircuit set.

29. The system of claim 26, wherein the means for stitching the subcircuit comprise:
for each net collection in a first NCset (NCset[0]),
if the subcircuit is the anchor subcircuit for the net collection,
(a) means for creating an instance for the RC subcircuit;
(b) means for creating additional nodes required for connecting a new subcircuit as described in the net collection;
(c) means for creating additional ports for calls to the instance as specified in the net collection;
(d) means for connecting the additional nodes and the additional ports as specified in the net collection; and
(e) means for reconnecting elements of the subcircuit.

30. The system of claim 29 further comprising:
if calls to the subcircuit have changed in upper level as specified in the net collection,
(a) means for creating additional ports for the subcircuit according to instances in upper level;
(b) means for creating additional nodes for new ports;
(c) means for changing calls from the subcircuit to a next level as specified in the net collection; and
(d) means for reconnecting elements in the subcircuit to new ports as specified in the net collection.

31. The system of claim 30 further comprising:
means for associating calls in the subcircuit as specified by the net collection to a next level; and
means for inserting subcircuits referenced by the calls in a next level subcircuit set.

32. The system of claim 26, wherein the means for preparing the next level for processing comprise:
means for swapping a current level subcircuit set and a next level subcircuit set;
means for initializing the next level subcircuit set; and
means for incrementing a level counter.

33. A computer program product, comprising a medium storing computer programs for execution by one or more computer systems, the computer program product comprising:
a netlist conversion module for converting a flat netlist into a hierarchical netlist, wherein the netlist conversion module is used in conjunction with at least a processing unit, a user interface and a memory, and the netlist conversion module includes one or more computer programs containing instructions for:
receiving the flat netlist;
traversing the flat netlist in a bottom-up fashion, identifying isomorphic subcircuits in the flat netlist;
creating a set of cross-coupling capacitor collections for storing information of cross-coupling capacitors;
creating a set of net collections for storing information of isomorphic subcircuits;
traversing each hierarchical level of the hierarchical netlist in a top-down fashion, generating the hierarchical netlist using the set of net collections and the set of cross-coupling capacitor collections; and
storing the hierarchical netlist in a memory device.

34. The computer program product of claim 33, wherein each cross-coupling capacitor collection comprises:
a cross-coupling capacitor;
a first set of call paths from a highest level of the hierarchical netlist to a lowest-level subcircuit which the cross-coupling capacitor is coupled to; and
nodes of the cross-coupling capacitor.

35. The computer program product of claim 33, wherein the instructions for creating a set of cross-coupling capacitor collections comprise:
identifying cross-coupling capacitors from the flat netlist;
recording a first set of call paths from a highest level of the hierarchical netlist to lowest-level subcircuits which the cross-coupling capacitors are coupled to; and
recording nodes of the cross-coupling capacitors.

36. The computer program product of claim 33, wherein each net collection comprises:
an anchor node;
a set of upper call paths from a highest level of the hierarchical netlist to the anchor node;
a resistor-capacitor (RC) subcircuit, wherein the RC subcircuit includes parasitic circuit
elements back-annotated into each net of the net collection; and
a set of lower call paths from the anchor node to parasitic circuit elements connected to the anchor node.

37. The computer program product of claim 33, wherein the instructions for creating a set of net collections comprise:
for each parasitic net in the flat netlist,
(a) identifying all ports connected to the parasitic net;
(b) identifying an anchor subcircuit, wherein the anchor subcircuit support multiple call paths for subcircuits below the anchor node;
(c) identifying an anchor node, wherein the anchor node references one or more subcircuits having substantially the same isomorphic behaviors;
(d) building a RC subcircuit at the anchor subcircuit;
(e) optimizing duplicate anchor nodes;
(f) updating the net collection; and repeating steps (a) to (f) until all parasitic nets in the flat netlist have been examined.

38. The computer program product of claim 37, wherein the instructions for building the RC subcircuit comprise;
forming a RC subcircuit for representing parasitic resistors and capacitors connected to the parasitic net; and
optimizing the RC subcircuit for creating a corresponding electrically substantially equivalent RC subcircuit having fewer resistor or capacitor elements.

39. The computer program product of claim 37, wherein the instructions for optimizing duplicate anchor nodes comprise:
if there is no parasitic net in the net collection share the same anchor node, creating a corresponding new net collection in the set of net collections;
if there is another parasitic net in the net collection share the same anchor node and the corresponding subcircuit of the anchor node does not have substantially the same isomorphic behaviors, creating a corresponding new net collection in the set of net collections; and
if there is another parasitic net in the net collection share the same anchor node and the corresponding subcircuit of the anchor node has substantially the same isomorphic behaviors, adding an instance path of the parasitic net to the set of net collections.

40. The computer program product of claim 37, wherein substantially the same isomorphic behaviors between two RC subcircuits comprise:
substantially the same set of input signals;
substantially the same set of internal topologies, internal states, and external loads; and
substantially the same set of output signals are produced within a predetermined threshold of signal tolerance in response to substantially the same set of input signals.

41. The computer program product of claim 37, wherein the instructions for updating the net collection comprise:
- traversing each node in the net collection;
- determining a sum of expected cross-coupling capacitance at each node;
- determining a sum of arrived cross-coupling capacitance at each node;
- compute an average capacitance at each node based on the sum of expected cross-coupling capacitance and the sum of arrived cross-coupling capacitance; and
- linking the average capacitance at each node to the corresponding RC subcircuit described in the net collection.

42. The computer program product of claim 33, wherein the instructions for generating the hierarchical netlist comprise:
- (1) traversing each hierarchical level in a top-down fashion;
- (2) traversing each subcircuit within each hierarchical level;
  - (a) forming a net collection set array (NCset) for each upper call path to an upper level subcircuit using the set of net collections;
  - (b) if the NCset comprises more than one upper call paths, splitting the subcircuit;
  - (c) stitching the subcircuit into the hierarchical netlist;
  - (d) associating the subcircuit with a next level;
  - (e) repeating steps (a) to (d) until all subcircuits in the hierarchical level have been processed;
- (3) preparing a next level for processing; and
- (4) repeating steps (1) to (3) until all levels of the hierarchical netlist have been processed.

43. The computer program product of claim 42, wherein the instructions for forming a NCset comprise:
- if net collection sets associated with the subcircuit exist in the NCset, associating the subcircuit with the net collection sets; and
- if the net collection sets associated with the subcircuit do not exist in the NCset, adding the net collection sets to the NCset.

44. The computer program product of claim 42, wherein the instructions for splitting the subcircuit comprise:
- traversing each net collection set referenced to the subcircuit in the NCset;
- creating a placeholder for the subcircuit;
- creating reference paths from upper level calls to the placeholder;
- associating the placeholder with the net collection set referenced to the subcircuit in the NCset; and
- inserting the placeholder into a current subcircuit set.

45. The computer program product of claim 42, wherein the instructions for stitching the subcircuit comprise:
- for each net collection in a first NCset (NCset[0]),
- if the subcircuit is the anchor subcircuit for the net collection,
  - (a) creating an instance for the RC subcircuit;
  - (b) creating additional nodes required for connecting a new subcircuit as described in the net collection;
  - (c) creating additional ports for calls to the instance as specified in the net collection;
  - (d) connecting the additional nodes and the additional ports as specified in the net collection; and
  - (e) reconnecting elements of the subcircuit.

46. The computer program product of claim 45 further comprising instructions for:
- if calls to the subcircuit have changed in upper level as specified in the net collection,
  - (a) creating additional ports for the subcircuit according to instances in upper level;
  - (b) creating additional nodes for new ports;
  - (c) changing calls from the subcircuit to a next level as specified in the net collection; and
  - (d) reconnecting elements in the subcircuit to new ports as specified in the net collection.

47. The computer program product of claim 46 further comprising instructions for:
- associating calls in the subcircuit as specified by the net collection to a next level; and
- inserting subcircuits referenced by the calls in a next level subcircuit set.

48. The computer program product of claim 42, wherein the instructions for preparing the next level for processing comprise:
- swapping a current level subcircuit set and a next level subcircuit set;
- initializing the next level subcircuit set; and
- incrementing a level counter.

* * * * *